(12) United States Patent
Ko et al.

(10) Patent No.: US 8,592,958 B2
(45) Date of Patent: *Nov. 26, 2013

(54) CHIP PACKAGE AND MANUFACTURING METHOD THEREOF

(75) Inventors: Dongkyun Ko, Kyunggi-Do (KR); Jung Lee, Kyunggi-Do (KR); Jaesun An, Kyunggi-Do (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/315,039

(22) Filed: Dec. 8, 2011

(65) Prior Publication Data

US 2012/0098109 A1    Apr. 26, 2012

Related U.S. Application Data

(63) Continuation of application No. 12/414,996, filed on Mar. 31, 2009, now Pat. No. 8,093,690.

(60) Provisional application No. 61/109,937, filed on Oct. 31, 2008.

(51) Int. Cl.
*H01L 23/552* (2006.01)
*H01L 21/56* (2006.01)

(52) U.S. Cl.
USPC ............... 257/660; 257/659; 257/E23.114

(58) Field of Classification Search
USPC .................... 257/659, 660, E23.114
See application file for complete search history.

(56) References Cited

U.S. PATENT DOCUMENTS

| | | | |
|---|---|---|---|
| 3,390,226 A | 6/1968 | Beyerlein | |
| 4,569,786 A | 2/1986 | Deguchi | |
| 4,717,948 A | 1/1988 | Sakai et al. | |
| 4,814,205 A | 3/1989 | Arcilesi et al. | |
| 4,821,007 A | 4/1989 | Fields et al. | |
| 5,140,745 A | 8/1992 | McKenzie, Jr. | |
| 5,166,772 A | 11/1992 | Soldner et al. | |
| 5,172,077 A | 12/1992 | Funada | |
| 5,353,498 A | 10/1994 | Fillion et al. | |
| 5,355,016 A | 10/1994 | Swirbel et al. | |
| 5,557,142 A | 9/1996 | Gilmore et al. | |
| 5,600,181 A | 2/1997 | Scott et al. | |
| 5,639,989 A | 6/1997 | Higgins, III | |
| 5,677,511 A | 10/1997 | Taylor et al. | |
| 5,694,300 A | 12/1997 | Mattei et al. | |
| 5,703,761 A | 12/1997 | Heiss | |
| 5,726,612 A | 3/1998 | Mandai et al. | |
| 5,729,437 A | 3/1998 | Hashimoto | |
| 5,776,798 A | 7/1998 | Quan et al. | |
| 5,847,930 A | 12/1998 | Kazle | |
| 5,864,088 A | 1/1999 | Sato et al. | |

FOREIGN PATENT DOCUMENTS

| | | |
|---|---|---|
| CN | 1442033 | 9/2003 |
| CN | 1774804 | 5/2006 |

(Continued)

*Primary Examiner* — Matthew W Such
*Assistant Examiner* — Robert Carpenter
(74) *Attorney, Agent, or Firm* — Klein, O'Neill & Singh, LLP

(57) ABSTRACT

A chip package including a shielding layer having a plurality of conductive connectors for better electromagnetic interferences shielding is provided. The conductive connectors can be flexibly arranged within the molding compound for better shielding performance. The shielding layer having the conductive connectors functions as the EMI shield and the shielding layer is electrically grounded within the package structure.

20 Claims, 16 Drawing Sheets

(56) References Cited

U.S. PATENT DOCUMENTS

| | | | |
|---|---|---|---|
| 5,886,876 | A | 3/1999 | Yamaguchi |
| 5,895,229 | A | 4/1999 | Carney et al. |
| 5,898,344 | A | 4/1999 | Hayashi |
| 5,966,052 | A | 10/1999 | Sakai |
| 5,977,626 | A | 11/1999 | Wang et al. |
| 5,998,867 | A | 12/1999 | Jensen et al. |
| 6,079,099 | A | 6/2000 | Uchida et al. |
| 6,093,972 | A | 7/2000 | Carney et al. |
| 6,150,193 | A | 11/2000 | Glenn |
| 6,194,250 | B1 | 2/2001 | Melton et al. |
| 6,225,694 | B1 | 5/2001 | Terui |
| 6,255,143 | B1 | 7/2001 | Briar |
| 6,261,680 | B1 | 7/2001 | Denman |
| 6,369,335 | B1 | 4/2002 | Wajima |
| 6,376,769 | B1 | 4/2002 | Chung |
| 6,448,632 | B1 | 9/2002 | Takiar et al. |
| 6,455,864 | B1 | 9/2002 | Featherby et al. |
| 6,472,598 | B1 | 10/2002 | Glenn |
| 6,472,743 | B2 | 10/2002 | Huang et al. |
| 6,479,903 | B2 | 11/2002 | Briar |
| 6,492,194 | B1 | 12/2002 | Bureau et al. |
| 6,521,978 | B2 | 2/2003 | Fenk et al. |
| 6,566,596 | B1 | 5/2003 | Askew |
| 6,586,822 | B1 | 7/2003 | Vu et al. |
| 6,602,737 | B2 | 8/2003 | Wu |
| 6,614,102 | B1 | 9/2003 | Hoffman et al. |
| 6,635,953 | B2 | 10/2003 | Wu |
| 6,686,649 | B1 | 2/2004 | Mathews et al. |
| 6,695,985 | B2 | 2/2004 | Igarashi et al. |
| 6,740,546 | B2 | 5/2004 | Corisis et al. |
| 6,740,959 | B2 | 5/2004 | Alcoe et al. |
| 6,757,181 | B1 | 6/2004 | Villanueva |
| 6,781,231 | B2 | 8/2004 | Minervini |
| 6,800,804 | B2 | 10/2004 | Igarashi et al. |
| 6,838,776 | B2 | 1/2005 | Leal et al. |
| 6,856,007 | B2 | 2/2005 | Warner |
| 6,865,084 | B2 | 3/2005 | Lin et al. |
| 6,881,896 | B2 | 4/2005 | Ebihara |
| 6,900,383 | B2 | 5/2005 | Babb et al. |
| 6,928,719 | B2 | 8/2005 | Kim et al. |
| 6,962,869 | B1 | 11/2005 | Bao et al. |
| 6,967,403 | B2 | 11/2005 | Chuang et al. |
| 6,975,516 | B2 | 12/2005 | Asahi et al. |
| 6,992,400 | B2 | 1/2006 | Tikka et al. |
| 6,998,532 | B2 | 2/2006 | Kawamoto et al. |
| 7,030,469 | B2 | 4/2006 | Mahadevan et al. |
| 7,045,385 | B2 | 5/2006 | Kim et al. |
| 7,049,682 | B1 | 5/2006 | Mathews et al. |
| 7,081,661 | B2 | 7/2006 | Takehara et al. |
| 7,125,744 | B2 | 10/2006 | Takehara et al. |
| 7,161,252 | B2 | 1/2007 | Tsuneoka et al. |
| 7,180,012 | B2 | 2/2007 | Tsuneoka et al. |
| 7,183,498 | B2 | 2/2007 | Ogura et al. |
| 7,186,928 | B2 | 3/2007 | Kikuchi et al. |
| 7,187,060 | B2 | 3/2007 | Usui |
| 7,294,587 | B2 | 11/2007 | Asahi et al. |
| 7,327,015 | B2 | 2/2008 | Yang et al. |
| 7,342,303 | B1 | 3/2008 | Berry et al. |
| 7,372,151 | B1 | 5/2008 | Fan et al. |
| 7,445,968 | B2 | 11/2008 | Harrison et al. |
| 7,446,265 | B2 | 11/2008 | Krohto et al. |
| 7,451,539 | B2 | 11/2008 | Morris et al. |
| 7,478,474 | B2 | 1/2009 | Koga |
| 7,488,903 | B2 | 2/2009 | Kawagishi et al. |
| 7,576,415 | B2 | 8/2009 | Cha et al. |
| 7,629,674 | B1 | 12/2009 | Foster |
| 7,633,170 | B2 | 12/2009 | Yang et al. |
| 7,633,765 | B1 | 12/2009 | Scanlan et al. |
| 7,643,311 | B2 | 1/2010 | Coffy |
| 7,656,047 | B2 | 2/2010 | Yang et al. |
| 7,700,411 | B2 | 4/2010 | Yang et al. |
| 7,745,910 | B1 | 6/2010 | Olson et al. |
| 7,829,981 | B2 | 11/2010 | Hsu |
| 2002/0053724 | A1 | 5/2002 | Lai et al. |
| 2002/0093108 | A1 | 7/2002 | Grigorov |
| 2004/0020673 | A1 | 2/2004 | Mazurkiewicz |
| 2004/0063242 | A1 | 4/2004 | Karnezos |
| 2004/0150097 | A1 | 8/2004 | Gaynes et al. |
| 2004/0178500 | A1 | 9/2004 | Usui |
| 2004/0231872 | A1 | 11/2004 | Arnold et al. |
| 2004/0252475 | A1 | 12/2004 | Tsuneoka et al. |
| 2005/0013082 | A1 | 1/2005 | Kawamoto et al. |
| 2005/0029673 | A1 | 2/2005 | Naka et al. |
| 2005/0039946 | A1 | 2/2005 | Nakao |
| 2005/0045358 | A1 | 3/2005 | Arnold |
| 2005/0056925 | A1* | 3/2005 | Takehara et al. ............... 257/702 |
| 2005/0208702 | A1 | 9/2005 | Kim |
| 2006/0145361 | A1 | 7/2006 | Yang et al. |
| 2006/0148317 | A1 | 7/2006 | Akaike et al. |
| 2006/0160261 | A1 | 7/2006 | Sheats et al. |
| 2006/0266547 | A1 | 11/2006 | Koga |
| 2008/0042301 | A1 | 2/2008 | Yang et al. |
| 2008/0061407 | A1 | 3/2008 | Yang et al. |
| 2008/0128890 | A1 | 6/2008 | Choi et al. |
| 2008/0174013 | A1 | 7/2008 | Yang et al. |
| 2009/0000114 | A1 | 1/2009 | Rao et al. |
| 2009/0000815 | A1 | 1/2009 | Hiner et al. |
| 2009/0000816 | A1 | 1/2009 | Hiner et al. |
| 2009/0002969 | A1 | 1/2009 | Madsen et al. |
| 2009/0002970 | A1 | 1/2009 | Leahy et al. |
| 2009/0002971 | A1 | 1/2009 | Carey et al. |
| 2009/0002972 | A1 | 1/2009 | Carey et al. |
| 2009/0025211 | A1 | 1/2009 | Hiner et al. |
| 2009/0035895 | A1 | 2/2009 | Lee et al. |
| 2009/0075428 | A1 | 3/2009 | Tang et al. |
| 2009/0102003 | A1 | 4/2009 | Vogt et al. |
| 2009/0102033 | A1 | 4/2009 | Raben |
| 2009/0194851 | A1 | 8/2009 | Chiu et al. |
| 2009/0194852 | A1 | 8/2009 | Chiu et al. |
| 2009/0230487 | A1 | 9/2009 | Saitoh et al. |
| 2009/0230523 | A1 | 9/2009 | Chien et al. |
| 2009/0230524 | A1 | 9/2009 | Chien et al. |
| 2009/0230525 | A1 | 9/2009 | Chien et al. |
| 2009/0230526 | A1 | 9/2009 | Chen et al. |
| 2009/0236700 | A1 | 9/2009 | Moriya |
| 2009/0256244 | A1 | 10/2009 | Liao et al. |
| 2009/0261470 | A1 | 10/2009 | Choi et al. |
| 2009/0294928 | A1 | 12/2009 | Kim et al. |
| 2010/0006330 | A1 | 1/2010 | Fu et al. |
| 2010/0013064 | A1 | 1/2010 | Hsu |
| 2010/0032815 | A1 | 2/2010 | An et al. |
| 2010/0109132 | A1 | 5/2010 | Ko et al. |
| 2010/0110656 | A1 | 5/2010 | Ko et al. |
| 2010/0199492 | A1 | 8/2010 | Hiner et al. |
| 2010/0207257 | A1 | 8/2010 | Lee |
| 2010/0207258 | A1 | 8/2010 | Eun et al. |
| 2010/0207259 | A1 | 8/2010 | Liao et al. |
| 2011/0006408 | A1 | 1/2011 | Liao |
| 2011/0115059 | A1 | 5/2011 | Lee et al. |
| 2011/0115060 | A1 | 5/2011 | Chiu et al. |
| 2011/0115066 | A1 | 5/2011 | Kim et al. |
| 2011/0127654 | A1 | 6/2011 | Weng et al. |

FOREIGN PATENT DOCUMENTS

| | | |
|---|---|---|
| JP | 55044737 | 3/1980 |
| JP | 58122759 | 7/1983 |
| JP | 59051555 | 3/1984 |
| JP | 63262860 | 10/1988 |
| JP | 64037043 | 2/1989 |
| JP | 64064298 | 3/1989 |
| JP | 2078299 | 3/1990 |
| JP | 3023654 | 1/1991 |
| JP | 3171652 | 7/1991 |
| JP | 4206858 | 7/1992 |
| JP | 5129476 | 5/1993 |
| JP | 8288686 | 1/1996 |
| JP | 2003273571 | 9/2003 |
| WO | WO2004060034 | 7/2004 |
| WO | WO2006/076613 | 7/2006 |

* cited by examiner

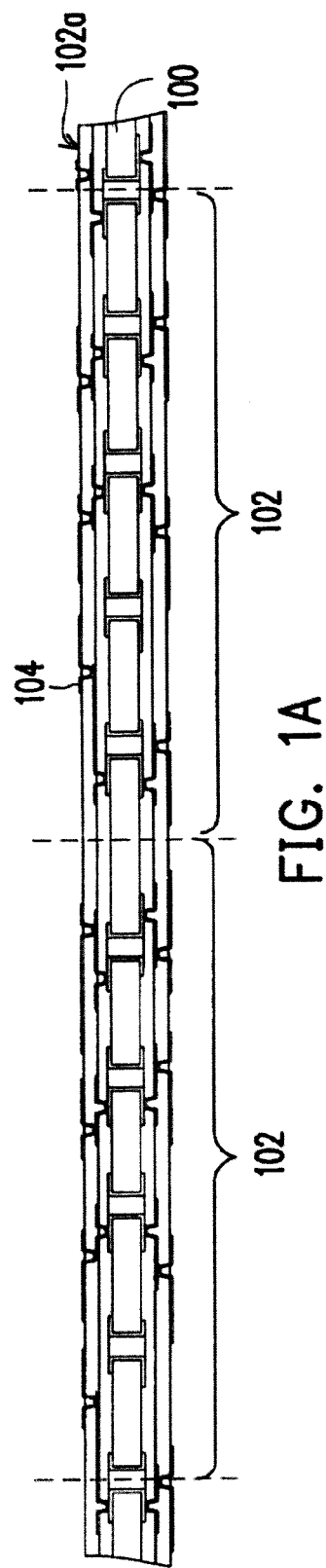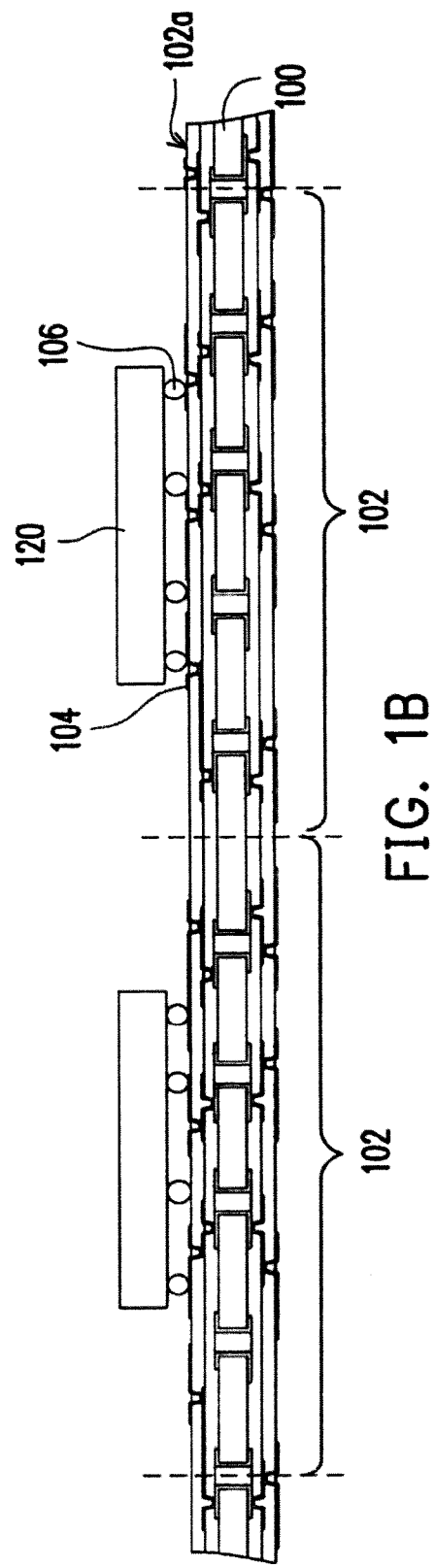

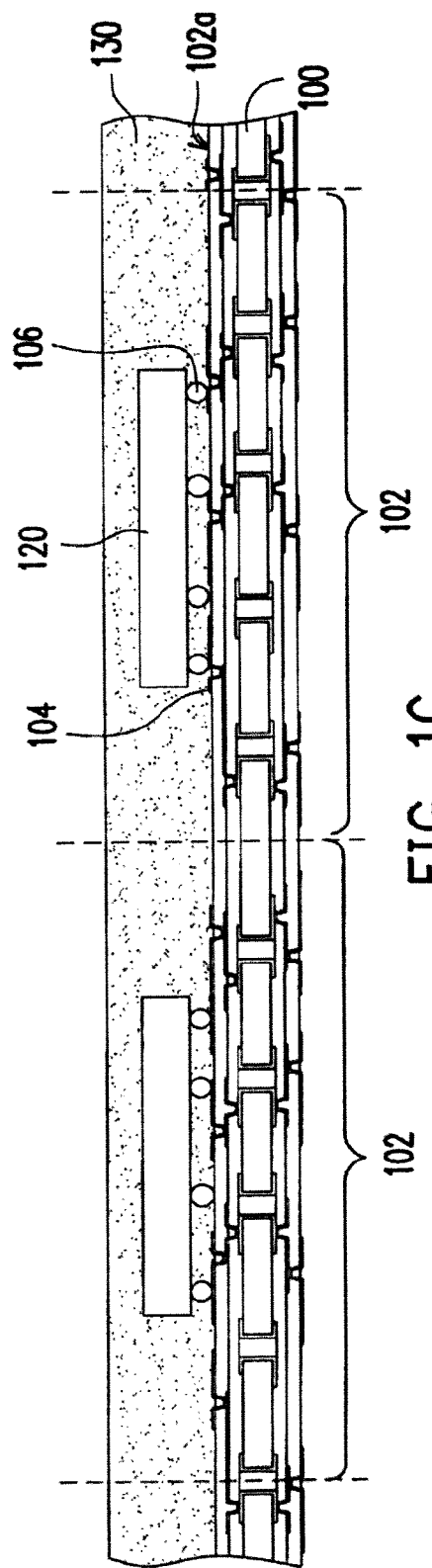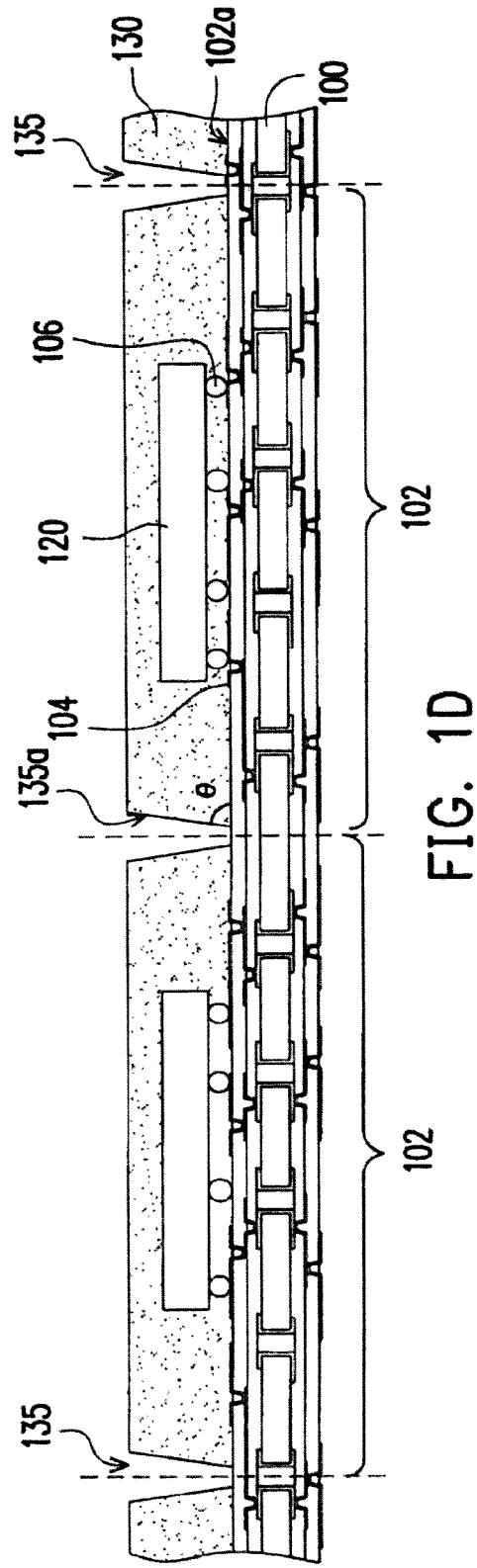

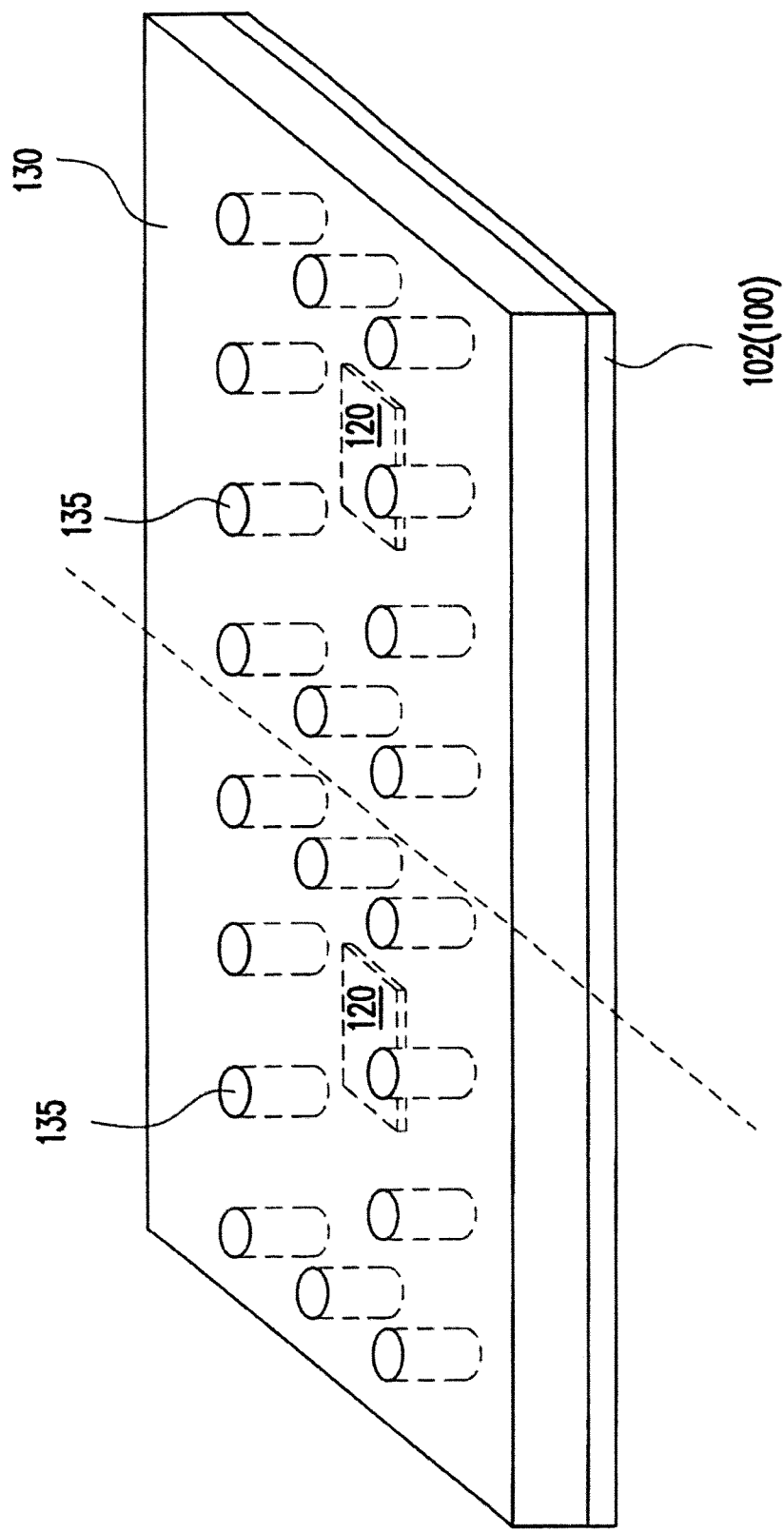
FIG. 1D"

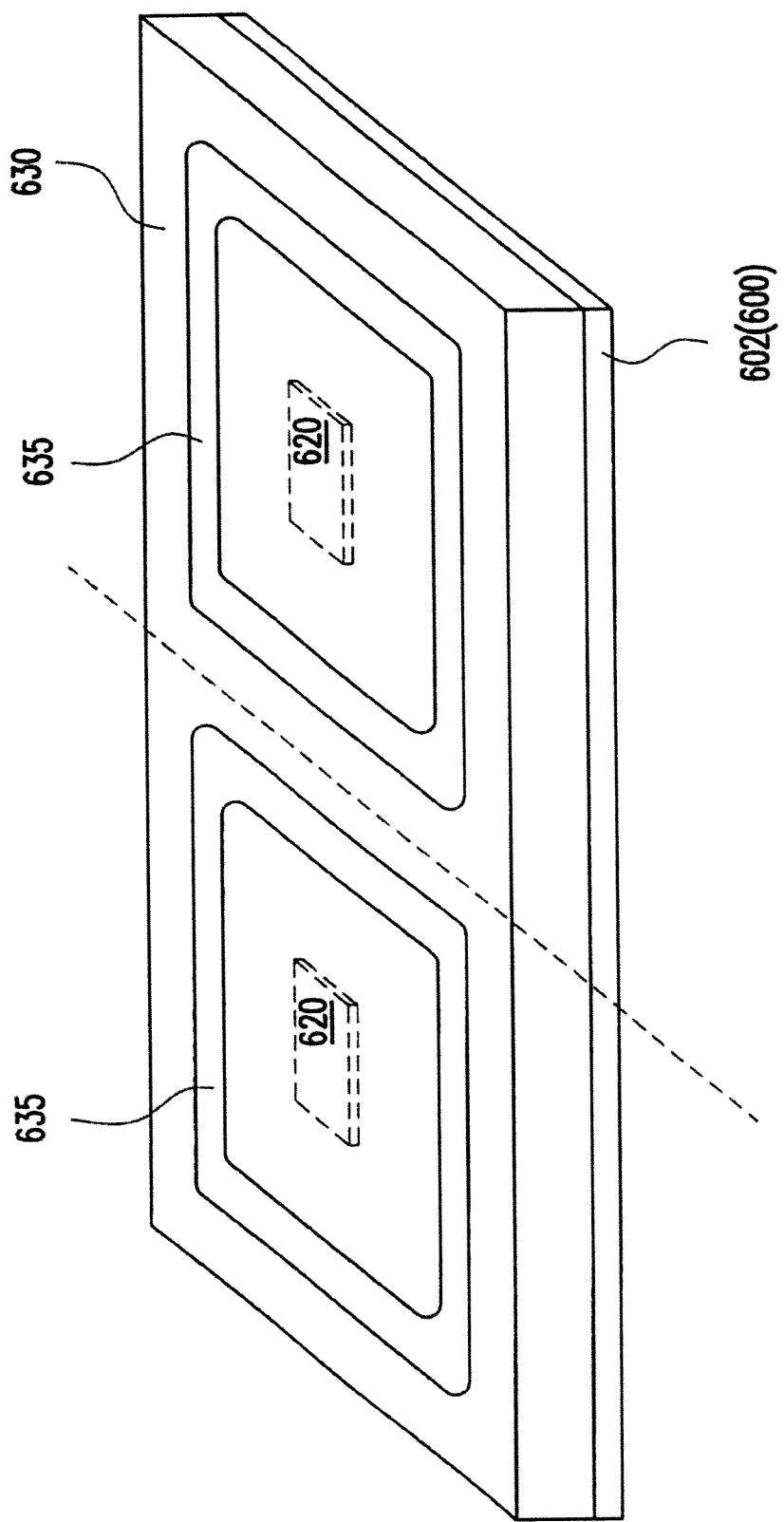
FIG. 6A"

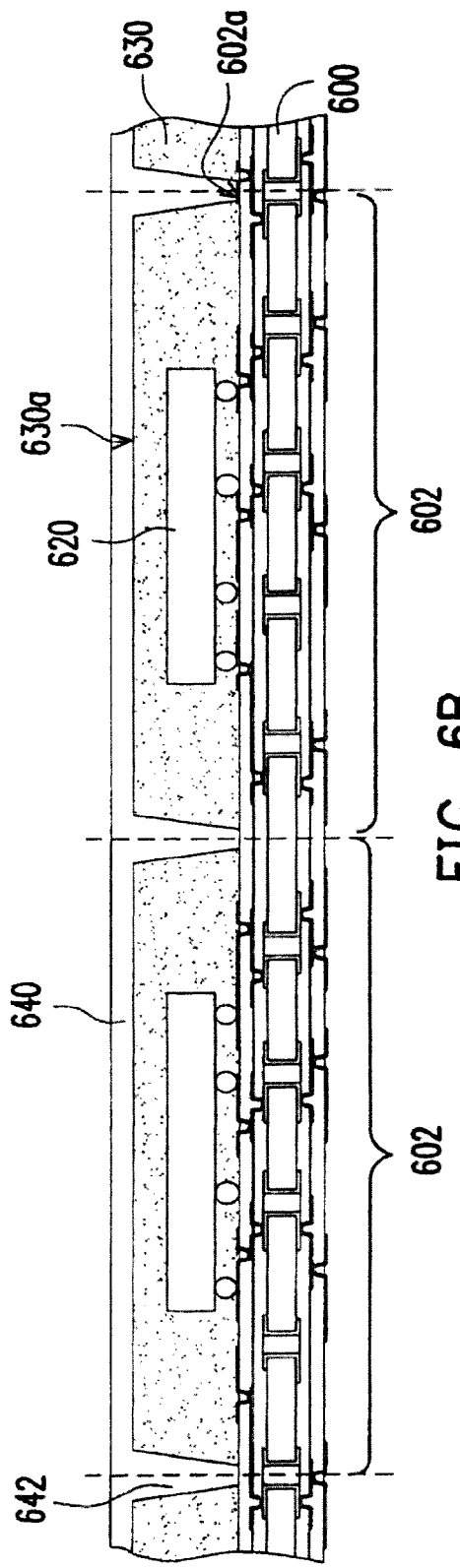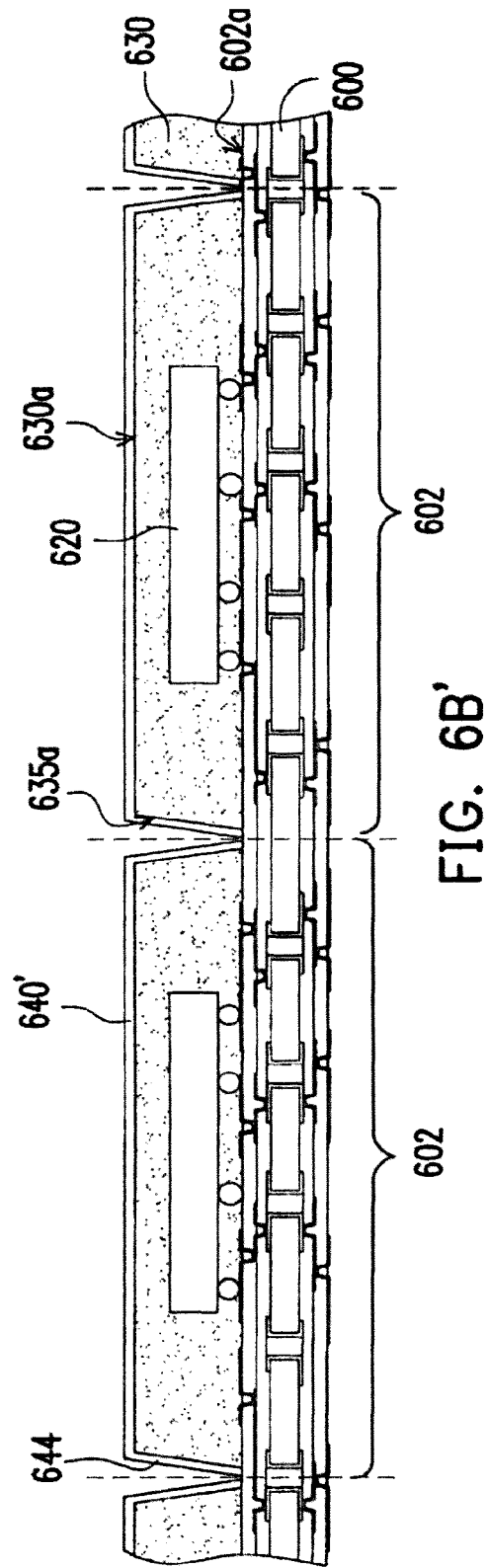

CHIP PACKAGE AND MANUFACTURING METHOD THEREOF

CROSS-REFERENCE TO RELATED APPLICATION

This application is a continuation of U.S. patent application Ser. No. 12/414,996, filed Mar. 31, 2009, now U.S. Pat. No. 8,093,690 which claims the priority benefit of U.S. provisional application Ser. No. 61/109,937, filed on Oct. 31, 2008. The entireties of the above-mentioned patent applications are hereby incorporated by reference herein and made a part of this specification.

BACKGROUND OF THE INVENTION

1. Field of the Invention

The present invention relates to a semiconductor device, and more particularly to a chip package.

2. Description of Related Art

Electro-magnetic interference (EMI) is a serious and challenging problem for most electronic devices or systems. As EMI disturbances commonly interrupt, degrade or limit the effective performance of the electronic device or the whole circuit of the electronic system, it is necessary for the electronic devices or systems to have efficient EMI protection to ensure the effective and safe operation.

EMI protection is particularly important in small-sized, densely packaged or sensitive electronic applications operating at high frequencies. Conventionally. EMI shielding solutions typically involve the use of metal plates and/or conductive gaskets, which are later attached or affixed at higher manufacturing costs.

SUMMARY OF THE INVENTION

In view of the foregoing, the present invention provides a manufacturing method of a chip package, which offers better design flexibility with less effort.

The present invention is further directed to a chip package with enhanced effectiveness of EMI shielding.

The present invention provides a chip package including a substrate, at least one chip disposed on the substrate, a molding compound and a shielding layer having a plurality of conductive connectors. The conductive connectors disposed on the substrate are arranged within the molding compound and around the chip. The shielding layer disposed over the molding compound covers the top surface of the molding compound and the shielding layer is electrically connected to the substrate through the conductive connectors.

According to embodiments of the present invention, the conductive connectors can be studs or plated via structures, either exposed by the sidewalls of the molding compound or not exposed by the sidewalls of the molding compound.

According to embodiments of the present invention, the chip is electrically connected to the laminate substrate of the chip package though a plurality of bumps.

The invention further provides a manufacturing method of a chip package. At least one chip is disposed on one of the substrate units of the matrix substrate, and the chip is electrically connected to the substrate unit. After forming a molding compound over the matrix substrate to encapsulate the chips, portions of the substrate units, a marking process is performed to form a plurality of vias by removing portions of the molding compound until a top surface of each substrate unit is exposed. Later, a shielding layer is formed over the molding compound to cover the molding compound and a plurality of connectors is formed within the vias to cover the exposed top surface of each substrate unit. Then a singulation process is performed to obtain a plurality of chip packages.

According to one embodiment of the present invention, the connectors can be arranged on sawing lines of the matrix substrate and on boundary lines of each substrate unit, so that the singulation process cuts through the connectors and the matrix substrate. Alternatively, the connectors can be arranged around boundary lines of each substrate unit with a distance apart, so that the singulation process does not cut through the connectors.

According to one embodiment of the present invention, the shielding layer and the connectors are formed from a conductive material by a spraying process, a sputtering process or a plating process.

According to one embodiment of the present invention, depending on whether the vias is filled up or partially filled, the shielding layer is formed simultaneously with a plurality of studs or plated via structures.

According to one embodiment of the present invention, the marking process comprises a laser digging process or a laser drilling process.

Based on the above, the shielding layer and the studs disposed on the substrate functions as an EMI shield of the chip package. According to the present invention, owning to the flexible and variable design of the shielding layer and the studs, the process window can be improved.

In order to the make the aforementioned and other objects, features and advantages of the present invention comprehensible, several embodiments accompanied with figures are described in detail below.

BRIEF DESCRIPTION OF THE DRAWINGS

FIGS. 1A through 1F' are schematic views showing manufacturing methods of the chip package according to preferred embodiments of the present invention.

FIGS. 6A through 6B' are schematic views showing certain steps of the manufacturing method of the chip package according to one preferred embodiment of the present invention.

DESCRIPTION OF EMBODIMENTS

Figure 1D:
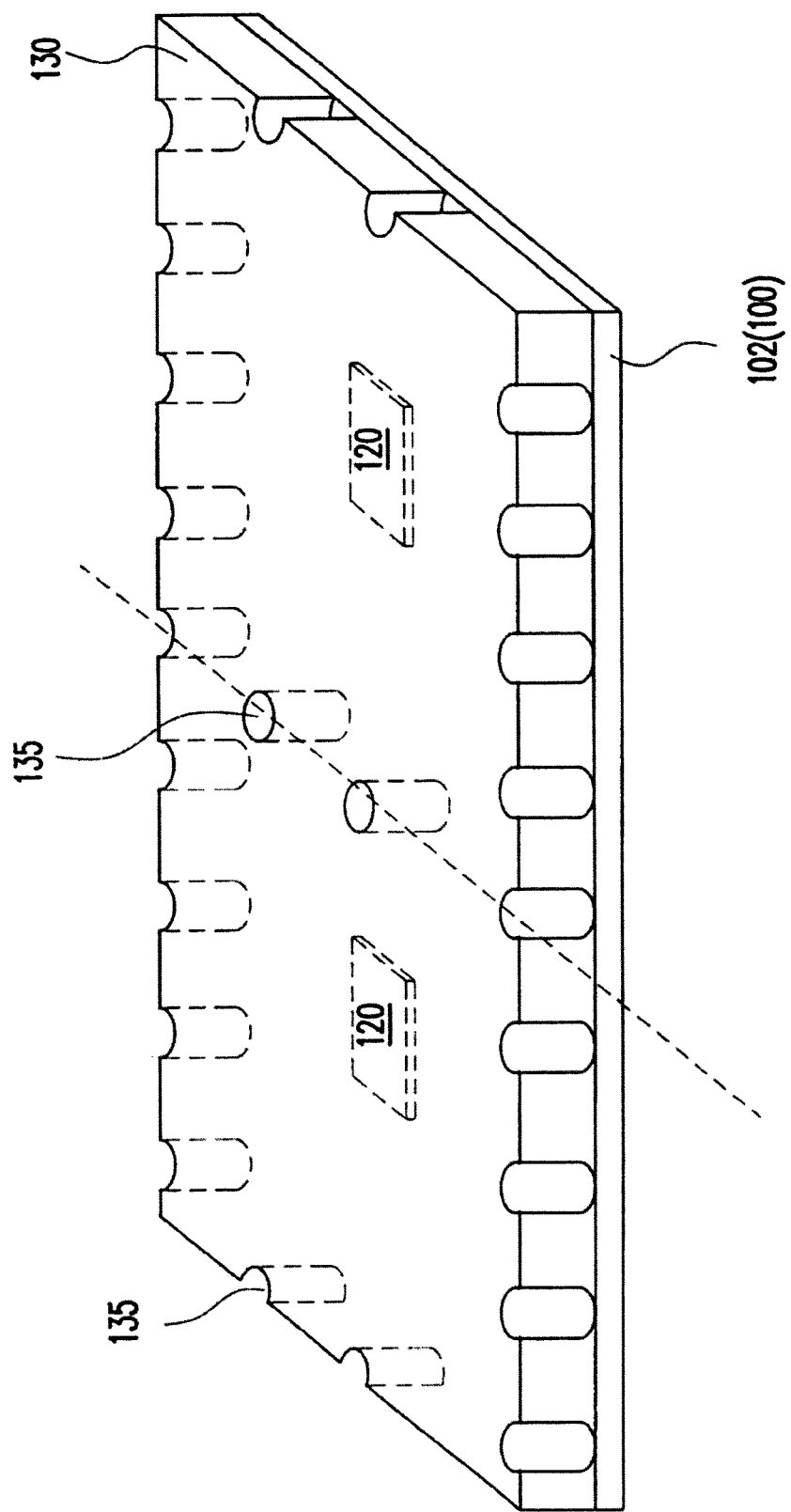

Reference will now be made in detail to the present preferred embodiments of the invention, examples of which are illustrated in the accompanying drawings. Wherever possible, the same reference numbers are used in the drawings and the description to refer to the same or like parts.

The manufacturing methods as described in the present invention can be used for fabricating various package structures and are more suitable for fabricating stacked type packages, multiple-chip packages, or high frequency device packages (including radio frequency device packages). Moreover, the manufacturing methods as described in the present invention are compatible with packaging processes utilizing build-up substrate manufacturing process or array substrate manufacturing process.

FIGS. 1A through 1F' are schematic views showing manufacturing methods of the chip package according to the preferred embodiments of the present invention. FIGS. 1D and 1D" are shown in three-dimensional schematic views, while FIGS. 1A-1D, 1E-1F and 1E'-1F' are shown in cross-sectional schematic views.

Referring to FIG. 1A, a matrix substrate 100 having a plurality of substrate 102 (defined by the subsequent sawing lines shown as dotted lines) is provided, while each substrate 102 includes a plurality of contacts 104 thereon. The contacts 104 function as bump pads for flip chip connecting technology. The substrate 100 can be a laminate substrate, for example, a printed circuit board (PCB).

Referring to FIG. 1B, at least one chip 120 is disposed on the top surface 102a of each substrate 102. Although a chip is provided herein, other surface mount components can be employed, and encompassed within the scope of this invention. The chip 120 is electrically connected to the contacts 104 of the substrate 102 through a plurality of bumps 106 therebetween. Although flip chip connecting technology is described herein, it is well encompassed within the scope of this invention to employ wire bonding technology (i.e. through wire connections). The chip 120 preferably is disposed within a central portion of the substrate 102.

Referring to FIG. 1C, a molding process is carried out to form a molding compound 130 on the matrix substrate 100 to encapsulate the chips 120, the contacts 104, the bumps 106 and at least a portion of the substrate 102. The molding process can be an over-molding process, for example. The material of the molding compound 130 may be epoxy resins or silicon resins, for example.

Referring to FIG. 1D, a marking process is performed to form a plurality of vias (via holes) 135 by removing portions of the molding compound 130 until the top surface 102a of the substrate 102 is exposed. The vias 135 are arranged surrounding the location of the chip 120. Preferably, the vias 135 are arranged between the chip 120 and the boundary or perimeter of each substrate 102. FIG. 1D' is the 3D schematic view of the structure depicted in FIG. 1D. As shown in FIGS. 1D and 1D', the individual vias 135 are arranged right on the boundary lines of the substrate 102 (the dotted lines). In this case, the subsequent sawing process will cut through the vias 135 arranged at the sawing lines (shown as doted lines). The marking process may include a laser drilling process or a laser digging process, for example. In addition, the vias 135 formed by laser process can afford high diameter accuracy and provide controlled taper. Preferably, the taper of the vias 13 is controlled to have a tilt angle Θ (between the sidewall 135a and the substrate surface 102a) ranging between about 60-90 degrees. Taking the vias 135 arranged around the boundary of each substrate 102 as an example, the marking process may removes portions of the molding compound 130 by drilling a plurality of separate holes arranged in a ring-shaped pattern within the molding compound 130, right on the boundary of each substrate 102.

On the other hand, the vias 135 may be arranged close to and within the boundary lines of the substrate 102 but are not located exactly on the boundary lines (the dotted lines) of the substrate 102, as shown in FIG. 1D". The vias 135 may be arranged surrounding the location of the chip 120 and close to the boundary lines of the substrate 102. For example, the vias 135 are arranged in a ring-shaped pattern and is spaced out from the boundary lines of the substrate 102 by a preset distance d, and d can be varied according to product requirements. However, the subsequent sawing process will not cut through the vias 135 arranged near the sawing lines. In general, the sizes or the shape of the vias 135 can be altered depending on the shielding requisites or other electrical properties of the package or even varied in accordance with the processing parameters.

Figure 1E:
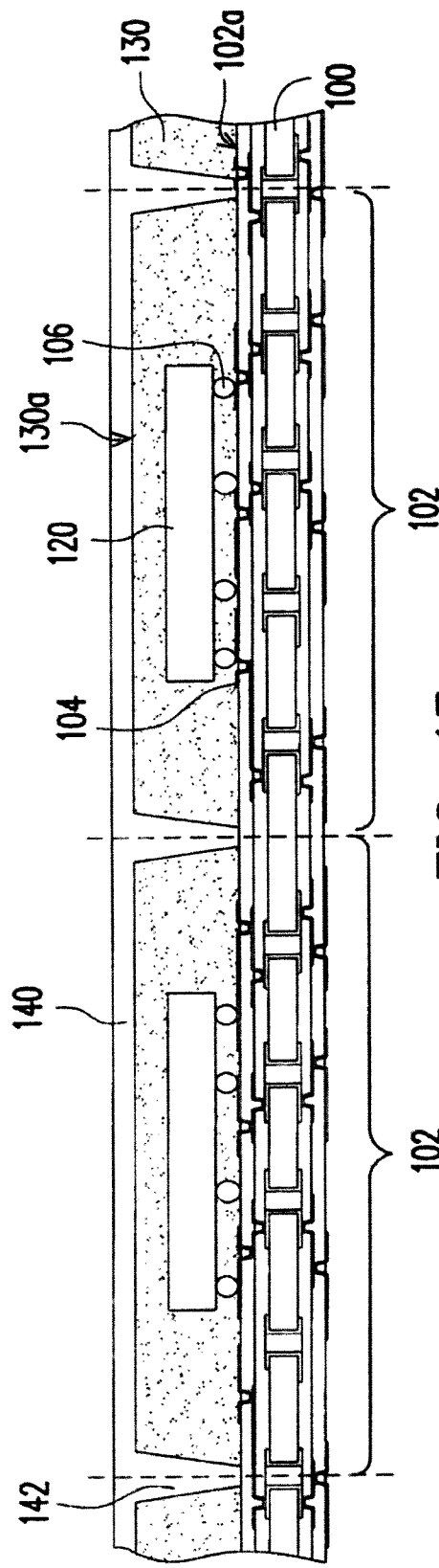

Referring to FIG. 1E, a shielding layer 140 is formed over the molding compound 130 to cover the top surface 130a of the molding compound 130, fill up the vias 135 and cover the exposed top surfaces 102a of the substrate 102 (i.e. the top surface 102a of the substrate 102 exposed by the vias 135). The shielding layer 140 can be formed by depositing a metal material (not shown) to cover the molding compound and fill up the vias 135 using a spray coating method, a plating method, or a sputtering method, for example. The metal material can be, for example, aluminum, copper, chromium, gold, silver, nickel, solder materials, or the combinations thereof. The studs 142 are simultaneously formed by filling up vias 135 during the process of forming the shielding layer 140.

Figure 1F:
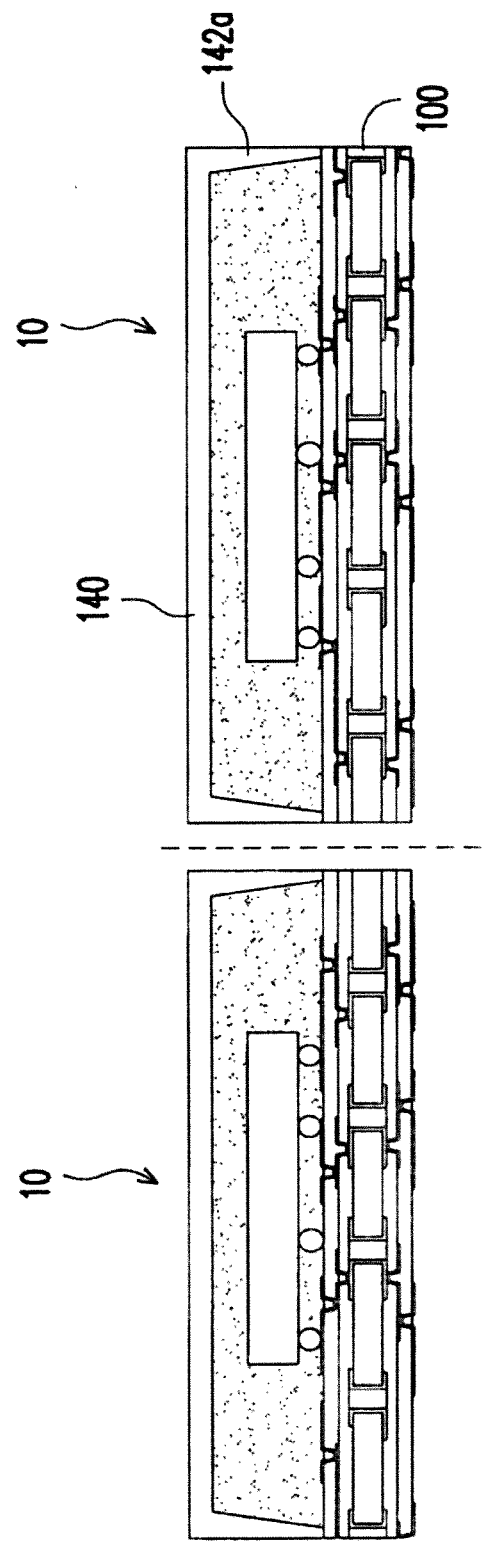
Figures 1E, 1F:
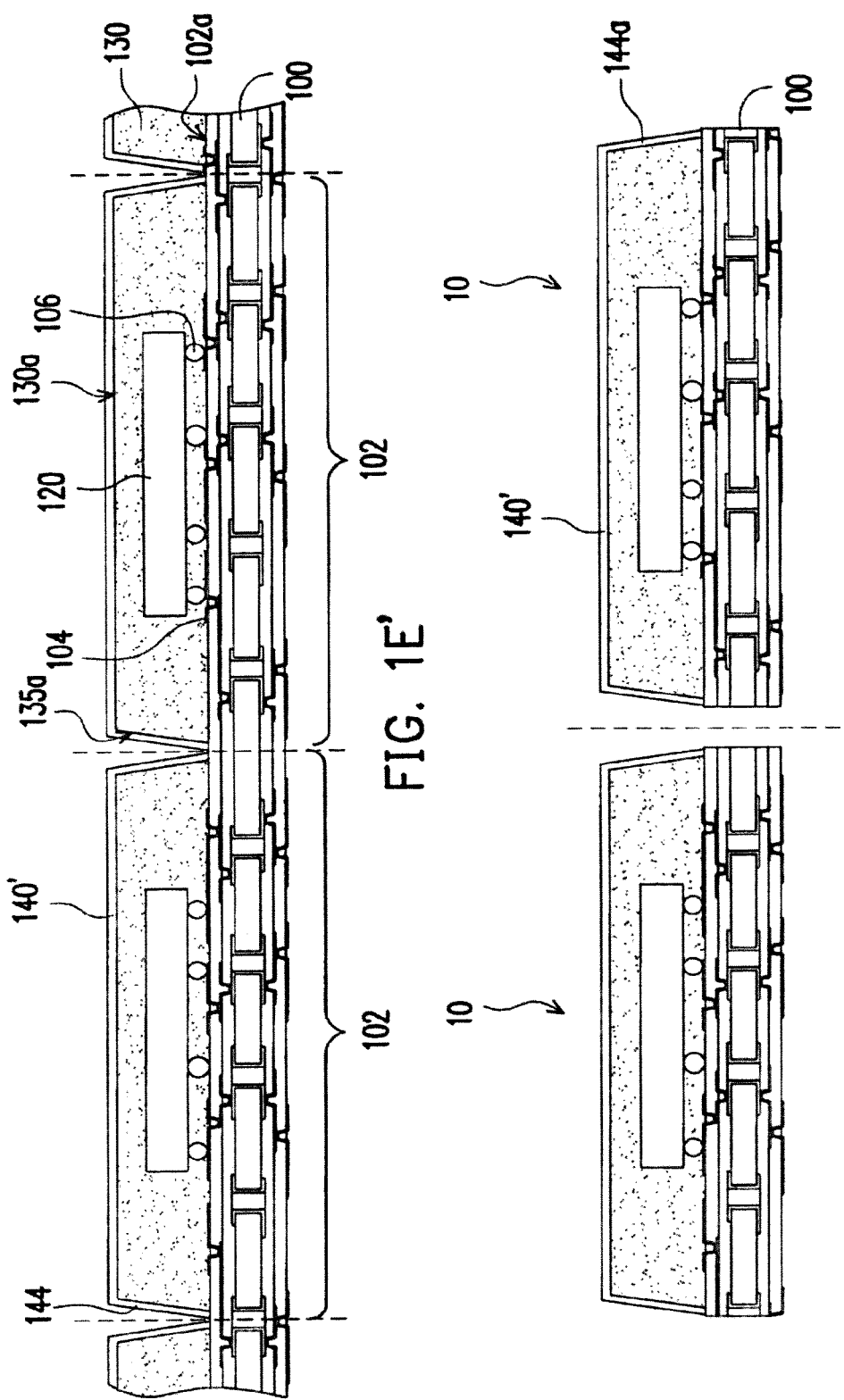

Finally, referring to FIG. 1F, a singulation process is performed to obtain the individual chip packages 10. The singulation process may be a blade sawing process, for example. As shown in FIGS. 1E-1F, the singulation process cuts through the studs 142 and the matrix substrate 100 so as to form the individual packages 10 with semi-studs 142a.

Alternatively, as shown in FIG. 1E', the shielding layer 140' may be formed over the molding compound 130 to cover the top surface 130a of the molding compound 130, and to conformally cover the sidewalls 135a of the vias 135 and the exposed top surfaces 102a of the substrate 102 to form a plurality of plated via structures 144. This way, the shielding layer 140' can be formed by depositing a metal material (not shown) to cover the molding compound without filling up the vias 135 by using a spray coating method, a plating method, or a sputtering method, for example. The plated via structure 144 may shaped as a cup or an inverted cap, depending on the shape or size of the vias 135. Following FIG. 1E', as shown in FIG. 1F', a singulation process is performed to cut through the matrix substrate 100 and the plated via structures 144 so as to obtain the individual chip packages 10 and semi-plated vias 144a. The singulation process may be a blade sawing process, for example.

Figure 2:
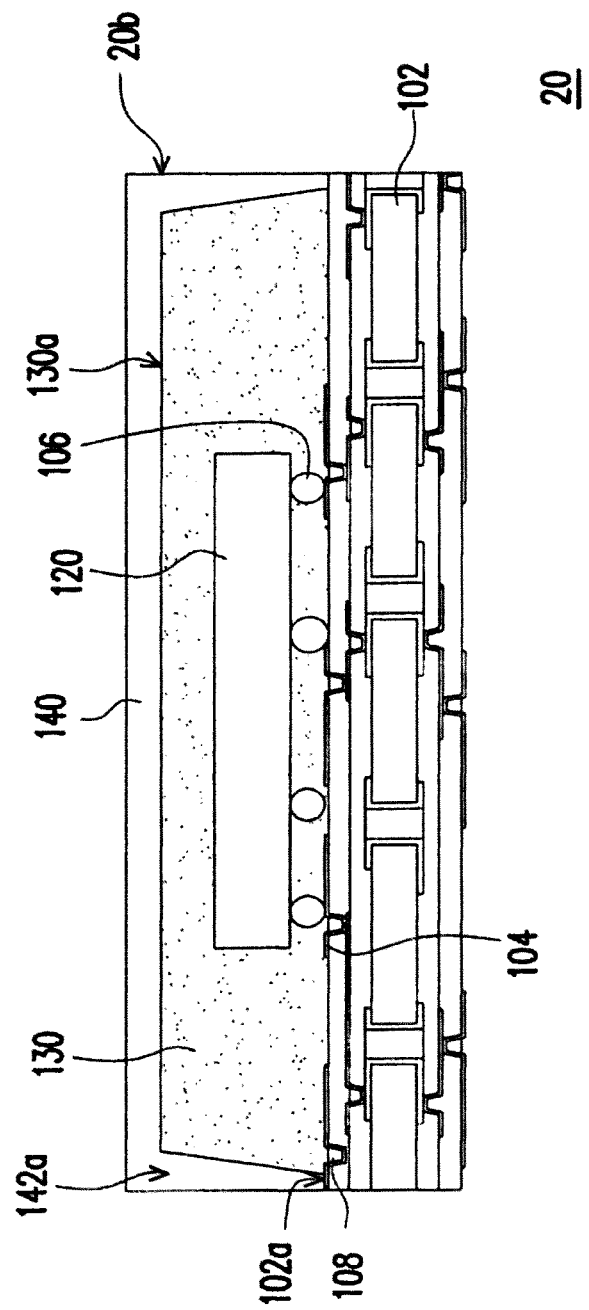
FIG. 2 is a cross-sectional view of a chip package according to an embodiment of the present invention.

FIG. 2 is a cross-sectional view of a chip package according to a preferred embodiment of the present invention. Referring to FIG. 2, the chip package 20 of the present embodiment includes a substrate 102, a plurality of contacts 104, a plurality of bumps 106, at least one chip 120, a molding compound 130 and a shielding layer 140. The substrate 102 can be a laminated substrate, for example, a two-layered or a four-layered laminated PCB substrate. The chip 120 can be a semiconductor chip, for example, a radio-frequency (RF) chip. The material of the shielding layer 140 may be copper, chromium, gold, silver, nickel, aluminum or alloys thereof or even a solder material, for example. The chips 120 are electrically connected to the substrates 102 through the contacts (bump pads) 104 and the bumps 106. The molding compound 130 encapsulates portions of the substrates 102, the bumps 106, and the chip 120. The shielding layer 140 includes a plurality of semi-studs 142a. The semi-studs herein refers to the cut studs from FIG. 1F, but can be regarded as studs in other contexts. The shape or structure of the studs 142 correlates to the location arrangements of the vias 135, as the studs 142 are formed to fill up the vias 135 (FIG. 1E). As shown in FIG. 2, the shielding layer 140 is disposed over the molding compound 130, covering the top surface 130a, while the semi-studs 142a covers the exposed top surfaces 102a of the substrate 102. As the studs 142 are cut through along with the molding compound 130 (cutting through the sawing lines) during the singulation process (FIG. 1F), portions of the molding compound 130 and the semi-studs 142a are exposed from the side surface 20b of the chip package 20. The shielding layer 140 is electrically connected to the substrate 102 through the semi-studs 142a and at least a ground vias 108 of the substrate 102, and the shielding layer 140 is electrically grounded through the semi-studs 142a and the ground via 108. Hence, taking advantage of the metal wirings or traces of the substrate surface, the shielding layer of the present invention can be grounded within the package structure using the ground plane of the substrate.

Figure 3:
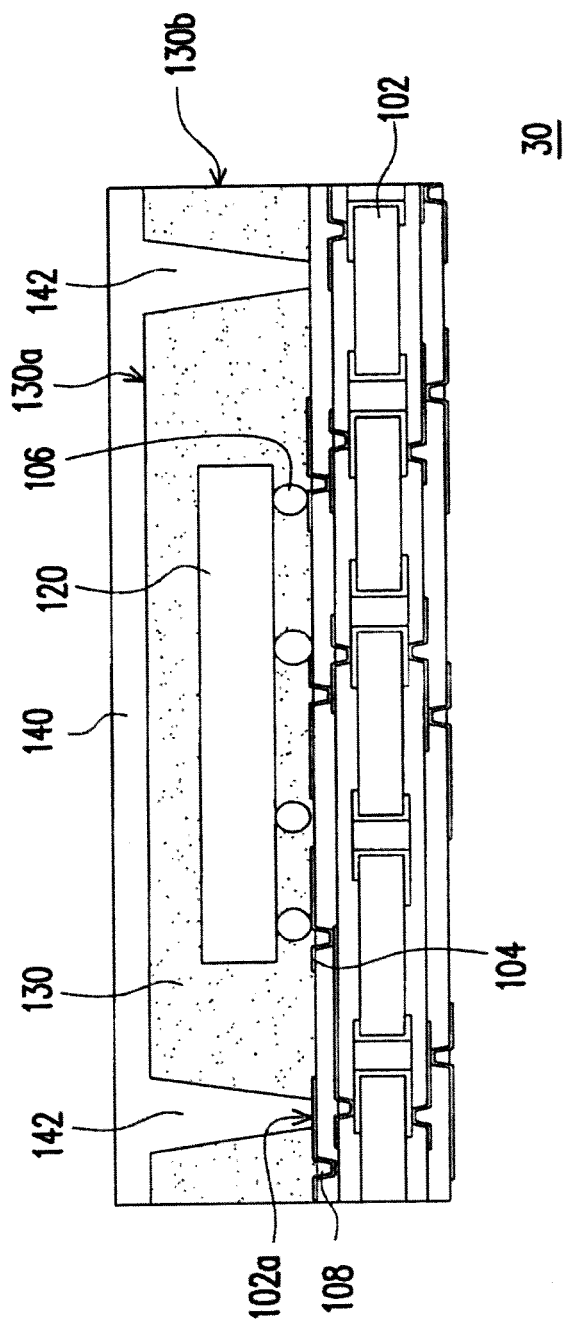
FIG. 3 is a cross-sectional view of a chip package according to another embodiment of the present invention.

According to another embodiment, as shown in FIG. 3, the shielding layer 140 is disposed over the molding compound 130 covering the top surface 130a of the molding compound 130. The shielding layer 140 also includes a plurality of studs 142 that are disposed on the substrate 102 and within the molding compound 130, covering the exposed top surfaces 102a of the substrate 102. Basically, the package structure 30 follows the manufacturing step shown in FIG. 1D" (rather than FIG. 1D), and the sawing process does not cut through the studs 142 arranged near the sawing street lines. In fact, the studs 142 can be considered as the filled vias structures, and the locations of the studs 142 in FIG. 3 are arranged surrounding the chip 120 and between the chip and the boundary lines of the substrate 102. Hence, the sidewalls 130b of the molding compound 130 are exposed, while the studs 142 are not exposed from the side surface of the chip package 30.

Figure 4:
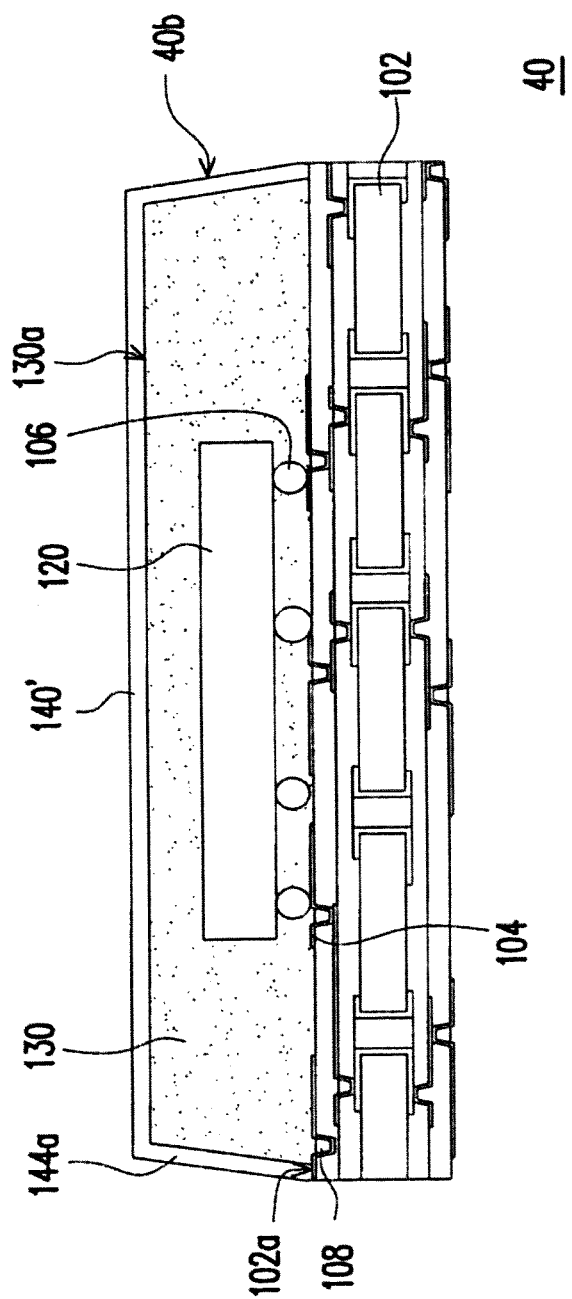
FIG. 4 is a cross-sectional view of a chip package according to another embodiment of the present invention.

According to another embodiment, as shown in FIG. 4, the package structure 40 is obtained following the manufacturing steps shown in FIGS. 1D, 1E' and 1F', the shielding layer 140' includes a plurality of semi-plated via structures 144a. The semi-plated via structures herein refers to the cut plated via structures from FIG. 1F', but can be regarded as plated via structures in other contexts. The shape or structure of the semi-plated via structures 144 correlates to the location arrangements of the vias 135, as the plated via structures 144 are formed as conformal coatings of the vias 135 (FIG. 1E'). As shown in FIG. 4, the shielding layer 140 covers the top surface 130a of the molding compound 130, while the semi-plated via structures 144a covers the exposed top surfaces 102a of the substrate 102. As the plated via structures 144 are cut through along with the molding compound 130 (cutting through the sawing lines) during the singulation process (FIG. 1F'), portions of the molding compound 130 and the semi-plated via structures 144a are exposed from the side surface 40b of the chip package 40. The shielding layer 140' is electrically connected to the substrate 102 through the semi-plated via structures 144a and at least a ground vias 108 of the substrate 102, and the shielding layer 140' is electrically grounded through the semi-plated via structures 144a and the ground via 108.

Figure 5:
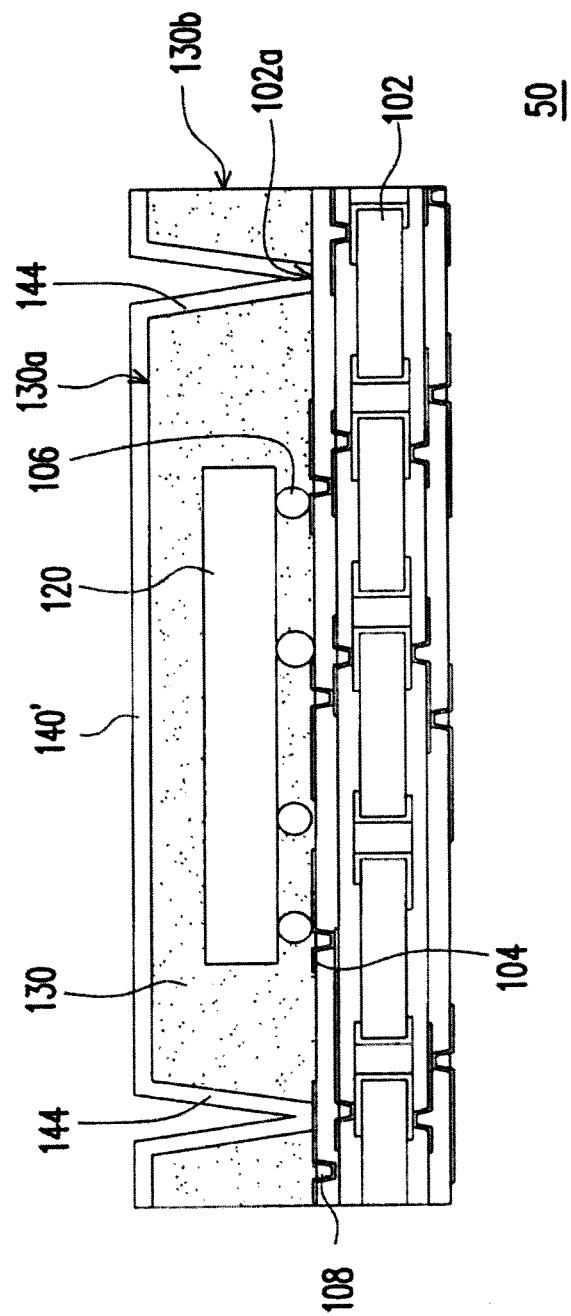
FIG. 5 is a cross-sectional view of a chip package according to another embodiment of the present invention.

Alternatively, as shown in FIG. 5, for the package structure 50 following the manufacturing step shown in FIG. 1D" and FIG. 1E', the shielding layer 140' includes a plurality of plated via structures 144. As the sawing process does not cut through the plated via structures 144 arranged near the sawing street lines, the sidewalls 130b of the molding compound 130 are exposed, while the plated via structures 144 are not exposed from the side surface of the chip package 50.

In brief, the studs (either cut semi-studs or uncut studs) or the plated via structures (either cut or uncut) can be considered as metal connectors of the top shielding layer. The shielding layer is physically and/or electrically connected to the underlying substrate through the studs (either cut semi-studs or uncut studs) or the plated via structures (either cut or uncut).

In accordance with the present invention, the manufacturing methods of the chip package shown in FIGS. 1A through 1F' may be further modified and described in the following embodiments.

Figure 6A:
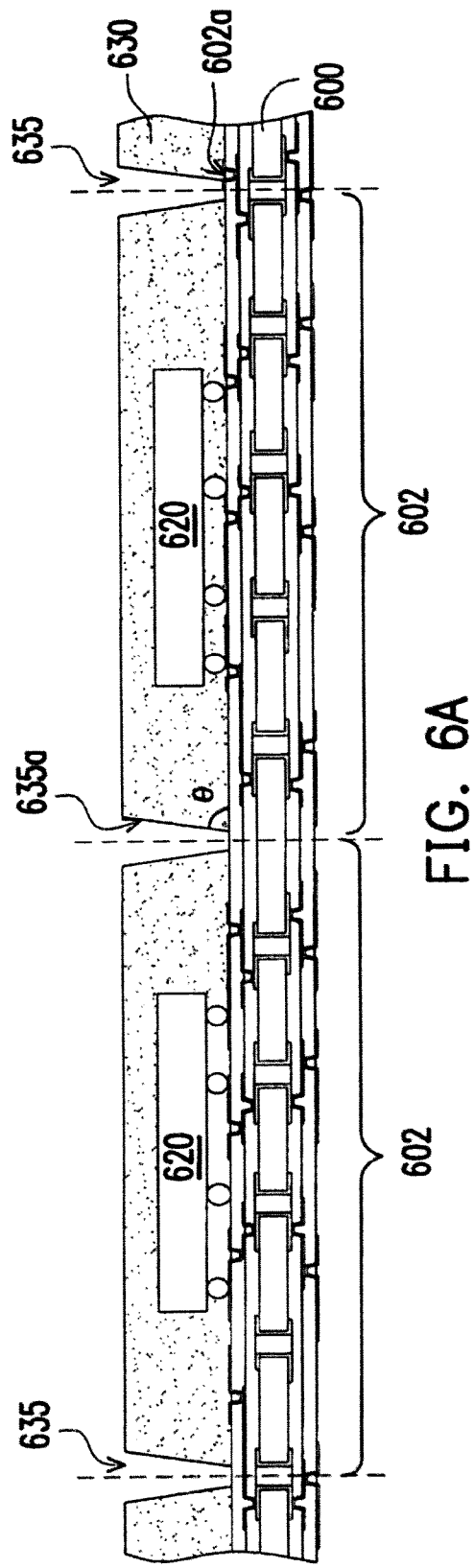
Figure 6A:
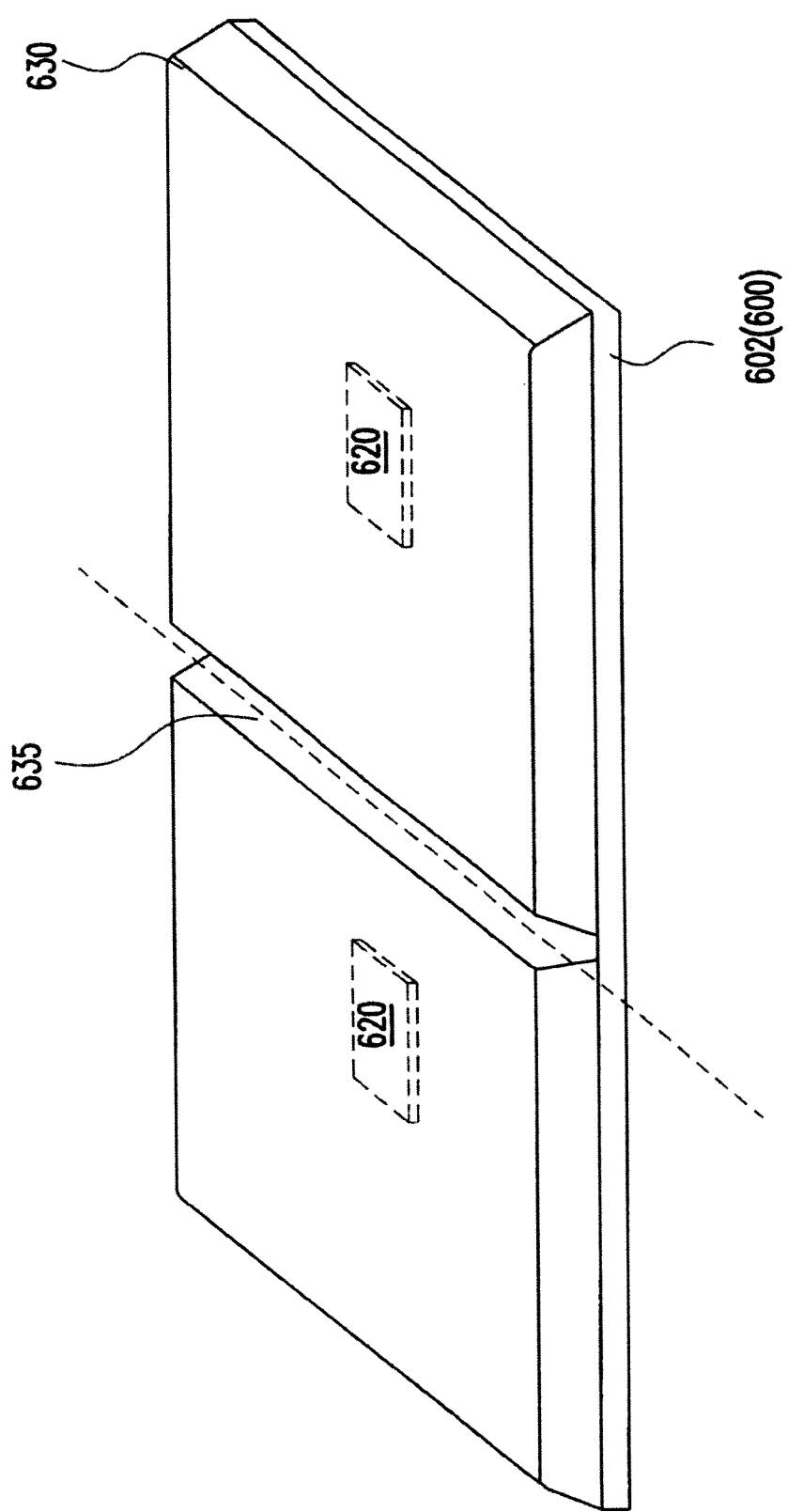

Following the process steps shown in FIGS. 1A-1C, as shown in FIG. 6A, a marking process is performed to form a plurality of trenches 635 by removing portions of the molding compound 630 until the top surface 602a of the substrate 602 is exposed. The trenches 635 are arranged surrounding the locations of the chips 620. Preferably, the trench is a ring-shaped trench and each trench 635 is arranged between the chip and the boundary or perimeter of each substrate 602. FIG. 6A' is the 3D schematic view of the structure depicted in FIG. 6A. As shown in FIGS. 6A and 6A', the individual trenches 635 are arranged right on the boundary lines of the substrate 602 (the dotted lines). In a way, the trenches 635 formed by the marking process are of a grid or latticed pattern. In this case, the subsequent sawing process will cut through the trenches 635 arranged at the sawing lines (shown as doted lines). The marking process may include a laser drilling process or a laser digging process, for example. In addition, the trenches 635 formed by laser process can afford high diameter accuracy and provide controlled taper. Preferably, the taper of the trench 635 is controlled to have a tilt angle Θ (between the sidewall 635a and the substrate surface 602a) ranging between about 60-90 degrees. Taking the trenches 635 arranged at the boundary of each substrate 602 as an example, the marking process may removes portions of the molding compound 630 by drilling a plurality of ring-shaped trenches within the molding compound 630, right on the boundary of each substrate 602.

On the other hand, the trenches 635 may be arranged near and inside the boundary lines of the substrate 602 but are not exactly located on the boundary lines (the dotted lines) of the substrate 602, as shown in FIG. 6A". The trenches 635 may be arranged close to the boundary lines of the substrate 602. However, the subsequent sawing process will not cut through the trenches 635 arranged near the sawing lines. In general, the sizes or the shape of the trenches 635 can be altered, depending on the shielding requisites or other electrical properties of the package or even varied in accordance with the processing parameters.

Similar to the step of FIG. 1E, a shielding layer 640 is formed over the molding compound 630 to cover the top surface 630a of the molding compound 630, fill up the trenches 635 and cover the exposed top surfaces 602a of the substrate 602 (i.e. the top surface 602a of the substrate 602 exposed by the trenches 635) to form filled ring structures 642 as shown in FIG. 6B. Alternatively, similar to the step of FIG. 1E', the shielding layer 640' may be formed over the molding compound 630 to cover the top surface 630a of the molding compound 630, and to conformally cover the sidewalls 635a of the trenches 635 and the exposed top surfaces 602a of the substrate 602 to form a plurality of hollow ring structures 644, as shown in FIG. 6B'.

Finally, following the singulation process shown in FIG. 1F or 1F', the individual chip packages are obtained.

Figure 7:
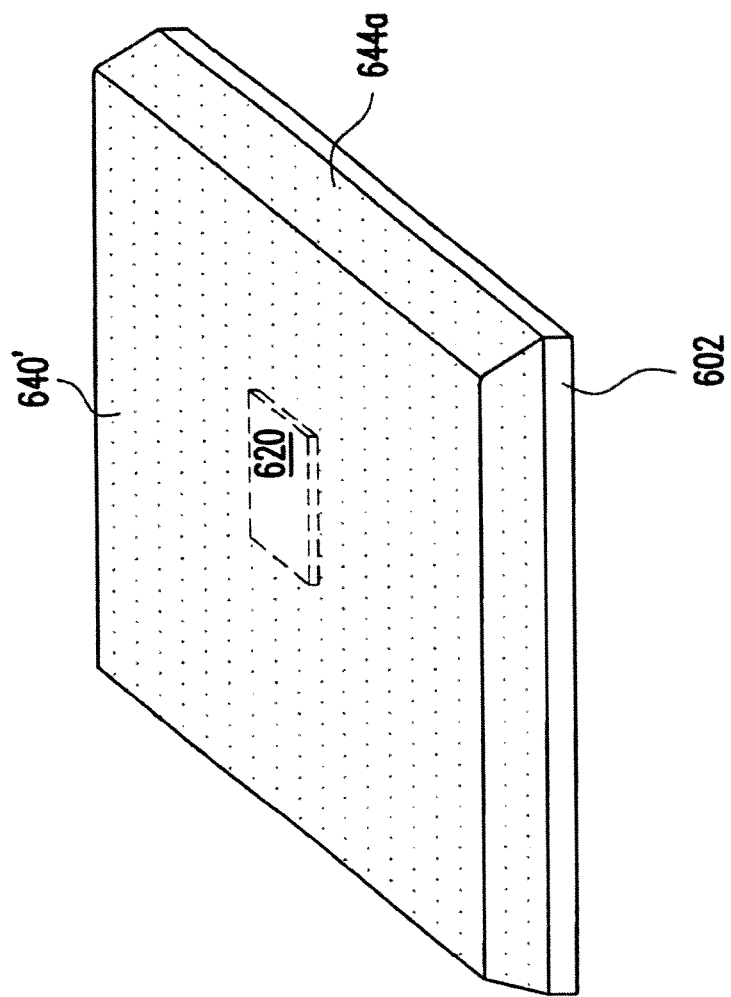
FIG. 7 is a 3D schematic view of a chip package according to another embodiment of the present invention.

According to another embodiment, as shown in FIG. 7, the package structure 70 is obtained following the manufacturing steps shown in FIGS. 1A-1C. 6A and 6B', the shielding layer 640' includes a plurality of cut hollow ring structures 644a. As shown in FIGS. 6B' and 7, the shielding layer 640' covers the top surface 630a of the molding compound 630, while the cut (or semi-) plated ring structures 644a covers the sidewalls 635a of the molding compound 630. As the singulation process cuts through the plated hollow ring structures 644 (cutting through the sawing lines), only the cut ring structures 644a can be seen (exposed) from the side surface of the chip package 70. The shielding layer 640' is electrically connected to the substrate 602 through the cut hollow ring structures 644a and at least a ground vias 608 of the substrate 602, and the shielding layer 640' is electrically grounded through the semi-plated ring structures 644a and the ground via 608.

Figure 8:
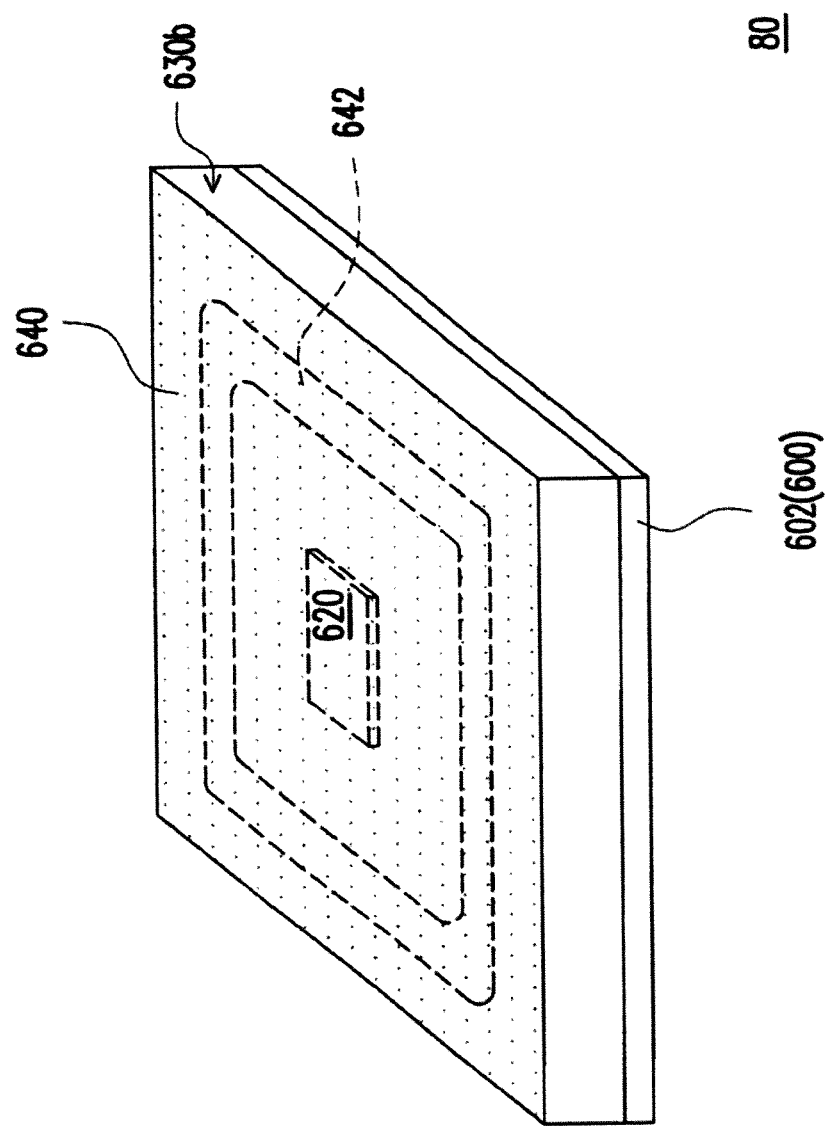
FIG. 8 is a 3D schematic view of a chip package according to another embodiment of the present invention.

Alternatively, as shown in FIG. 8, for the package structure 80 following the manufacturing step shown in FIG. 1A-1C, 6A" and 6B, the shielding layer 640 covers the top surface 630a of the molding compound 630 and includes a plurality of filled ring structures 642. As the sawing process does not cut through the solid ring structures 642 arranged near the sawing street lines, the sidewalls 630b of the molding compound 630 are exposed, while the filled ring structures 642 are not exposed from the side surface of the chip package 80.

In brief, the solid ring structures (either cut ring structures or uncut ring structures) or the hollow ring structures (either cut or uncut) can be considered as metal connectors of the top shielding layer. The shielding layer is physically and/or electrically connected to the underlying substrate through the solid ring structures (either cut or uncut) or the hollow ring structures (either cut or uncut).

In the chip package structures of the present embodiment, the shielding layer and the connectors disposed on the substrate together function as an EMI shield, protecting the package from the EMI radiation from the surrounding radiation sources.

The design of the EMI shielding for the package structure of this invention can be flexibly adjusted according to the product requirements because the shape or locations of the vias 135 can be precisely controlled by the marking process. Furthermore, as the shielding layer includes connectors arranged within the molding compound, the EMI shielding performance is improved.

In summary, the shielding layer together with the conductive connectors can efficiently shelter the chip package of the present invention from the outside EMI radiation, thus boosting the EMI shielding. Following the manufacturing processes disclosed in the present invention, it is possible to establish an electrical ground path within the package structure, devoid of using an extra ground plane. Accordingly, such design is compatible with the packaging of high frequency devices, particularly, radio frequency devices.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A chip package, comprising:
a substrate having an upper surface;
at least one chip disposed on the substrate and electrically connected to the substrate;
a molding compound disposed over the substrate and exposing portions of the substrate upper surface;
an electromagnetic interference (EMI) shield including
a first portion disposed over an upper surface of the molding compound;
a second portion forming a plurality of conductive connectors disposed in spaced through holes circumscribing a lateral periphery of the molding compound, a lateral surface of at least one of the plurality of conductive connectors being concave; and
a third portion disposed over all portions of the substrate upper surface exposed from the molding compound.

2. The chip package of claim 1, wherein the at least one of the conductive connectors extends between the first portion of the EMI shield and the substrate.

3. The chip package of claim 2, wherein the conductive connectors provide a ground path between the first portion and the substrate.

4. The chip package of claim 1, wherein the conductive connectors provide partial EMI shielding.

5. The chip package of claim 1, wherein at least one of the plurality of conductive connectors is semi-cylindrical.

6. The chip package of claim 1, wherein the second portion is also disposed over a lateral surface of the molding compound.

7. The chip package of claim 6, wherein the second portion is coupled to the lateral surface of at least one of the conductive connectors.

8. A semiconductor package comprising:
a substrate having an upper surface;
a chip electrically connected to the substrate;
a package body encapsulating the chip and leaving portions of the substrate upper surface exposed; and
means for electromagnetic interference (EMI) shielding, including
first horizontal shielding means for protecting an upper surface of the package body from EMI;
vertical shielding means for protecting lateral surfaces of the package body from EMI; and
second horizontal shielding means for covering all of the portions of the substrate upper surface exposed from the package body.

9. The semiconductor package of claim 8, wherein the vertical shielding means comprises a plurality of conductive vias disposed about a lateral periphery of the package body.

10. The semiconductor package of claim 9, wherein at least one of the conductive vias extends between the first portion of the EMI shield and the substrate.

11. The semiconductor package of claim 10, wherein the at least one of the conductive vias provides a ground path between the first portion and the substrate.

12. The semiconductor package of claim 9, wherein the conductive vias provide partial EMI shielding.

13. The semiconductor package of claim 10, wherein at least one of the plurality of conductive vias is semi-cylindrical.

14. The semiconductor package of claim 9, wherein the vertical shielding means is disposed over a lateral surface of the molding compound and is coupled to the conductive vias.

15. The semiconductor package of claim 9, wherein the plurality of conductive vias are oriented at a taper angle with respect to the substrate, and the taper angle is between 60°-90°.

16. A chip package, comprising:
a substrate having an upper surface;
at least one chip electrically connected to the substrate;
a molding compound encapsulating the chip and defining a lateral surface the molding compound leaving portions of the substrate upper surface adjacent a periphery thereof exposed;
an electromagnetic interference (EMI) shield including
a first portion disposed over an upper surface of the molding compound;
a second portion circumscribing the chip and including a plurality of conductive connectors spaced from one another, a lateral surface of at least one of the plurality of conductive connectors being recessed from the lateral surface of the molding compound; and a third portion covering all of the exposed portions of the upper surface of the substrate.

17. The chip package of claim 16, wherein the at least one of the conductive connectors extends between the first portion of the EMI shield and the substrate.

18. The chip package of claim 17, wherein the conductive connectors provide a ground path between the first portion and the substrate.

19. The chip package of claim 16, wherein the conductive connectors provide partial EMI shielding.

20. The chip package of claim 16, wherein at least one of the plurality of conductive connectors is semi-cylindrical.

\* \* \* \* \*